(12) United States Patent
Philipp (10) Patent No.: US 9,024,790 B2
(45) Date of Patent: *May 5, 2015

(54) CAPACITIVE KEYBOARD WITH NON-LOCKING REDUCED KEYING AMBIGUITY

(75) Inventor: Harald Philipp, Zug (CH)

(73) Assignee: Atmel Corporation, San Jose, CA (US)

( * ) Notice: Subject to any disclaimer, the term of this patent is extended or adjusted under 35 U.S.C. 154(b) by 444 days.

This patent is subject to a terminal disclaimer.

(21) Appl. No.: 13/347,312

(22) Filed: Jan. 10, 2012

(65) Prior Publication Data

US 2012/0105260 A1 May 3, 2012

Related U.S. Application Data (63) Continuation of application No. 12/899,229, filed on Oct. 6, 2010, now Pat. No. 8,102,286, which is a continuation of application No. 11/279,402, filed on Apr. 12, 2006, now Pat. No. 7,821,425, which is a (Continued)

(51) Int. Cl.
*H03M 11/00* (2006.01)
*G06F 3/023* (2006.01)
*G06F 3/041* (2006.01)

(Continued)

(52) U.S. Cl.
CPC ............ *G06F 3/0237* (2013.01); *G06F 3/0416* (2013.01); *G06F 3/044* (2013.01); *H03K 17/9622* (2013.01); *H03K 17/9643* (2013.01); *H03K 2217/960705* (2013.01)

(58) Field of Classification Search
CPC .... H03M 11/20; G06F 3/0237; G06F 3/0416; G06F 3/044

USPC ............ 341/20, 22, 26, 33; 345/173; 715/773
See application file for complete search history.

(56) References Cited

U.S. PATENT DOCUMENTS 4,616,213 A 10/1986 Danish
4,651,133 A 3/1987 Ganesan et al.

(Continued)

FOREIGN PATENT DOCUMENTS

EP 1 381 160 A1 1/2004 ............ H03M 11/20
WO WO 2012/129247 A2 9/2012

OTHER PUBLICATIONS

Intellectual Property Office (IPO), Taiwan Office Action and English Translation of Text and Search Report, ROC (Taiwan) Patent Appl. No. 095123644, file 080900.0489 (14 pgs), Jan. 23, 2013.

(Continued)

*Primary Examiner* — Albert Wong
(74) *Attorney, Agent, or Firm* — Baker Botts LLP (57) ABSTRACT

Keyboards, keypads and other data entry devices can suffer from a keying ambiguity problem. In a small keyboard, for example, a user's finger is likely to overlap from a desired key to onto adjacent ones. An iterative method of removing keying ambiguity from a keyboard comprising an array of capacitive keys involves measuring a signal strength associated with each key in the array, comparing the measured signal strengths to find a maximum, determining that the key having the maximum signal strength is the unique user-selected key, and maintaining that selection until either the initially selected key's signal strength drops below some threshold level or a second key's signal strength exceeds the first key's signal strength.

24 Claims, 7 Drawing Sheets

Related U.S. Application Data continuation-in-part of application No. 11/160,885, filed on Jul. 14, 2005, now Pat. No. 7,256,714, which is a continuation of application No. 10/617,602, filed on Jul. 11, 2003, now Pat. No. 6,993,607.

(60) Provisional application No. 60/597,851, filed on Dec. 21, 2005, provisional application No. 60/395,368, filed on Jul. 12, 2002.

(51) Int. Cl.
*G06F 3/044* (2006.01)
*H03K 17/96* (2006.01)

(56) References Cited

U.S. PATENT DOCUMENTS

| | | | |
|---|---|---|---|
| 4,920,343 | A | 4/1990 | Schwartz |
| 5,508,700 | A | 4/1996 | Taylor et al. |
| 5,933,102 | A | 8/1999 | Miller et al. |
| 6,657,616 | B2 | 12/2003 | Sims |
| 7,487,461 | B2 | 2/2009 | Zhai et al. |
| 7,663,607 | B2 | 2/2010 | Hotelling |
| 7,864,503 | B2 | 1/2011 | Chang |
| 7,875,814 | B2 | 1/2011 | Chen |
| 7,920,129 | B2 | 4/2011 | Hotelling |
| 8,031,094 | B2 | 10/2011 | Hotelling |
| 8,031,174 | B2 | 10/2011 | Hamblin |
| 8,040,326 | B2 | 10/2011 | Hotelling |
| 8,049,732 | B2 | 11/2011 | Hotelling |
| 8,179,381 | B2 | 5/2012 | Frey |
| 8,217,902 | B2 | 7/2012 | Chang |
| 8,723,824 | B2 | 5/2014 | Myers |
| 2004/0008129 | A1 | 1/2004 | Philipp |
| 2004/0104826 | A1 | 6/2004 | Philipp |
| 2008/0309635 | A1 | 12/2008 | Matsuo |
| 2009/0315854 | A1 | 12/2009 | Matsuo |
| 2012/0242588 | A1 | 9/2012 | Myers |
| 2012/0242592 | A1 | 9/2012 | Rothkopf |
| 2012/0243151 | A1 | 9/2012 | Lynch |
| 2012/0243719 | A1 | 9/2012 | Franklin |
| 2013/0076612 | A1 | 3/2013 | Myers |

OTHER PUBLICATIONS

*The Electroquasistatics of the Capacitive Touch Panel*, May/Jun. 1990 IEEE, vol. 26, No. 3, P.T. Krein and R.D. Meadows.

Office Action (and English translation) for CN 200600528529, dated Jan. 19, 2011.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

CAPACITIVE KEYBOARD WITH NON-LOCKING REDUCED KEYING AMBIGUITY

RELATED APPLICATIONS

This application is a continuation of U.S. application Ser. No. 12/899,229 filed Oct. 6, 2010, which is a continuation of U.S. application Ser. No. 11/279,402 filed Apr. 12, 2006, now U.S. Pat. No. 7,821,425, which claims priority from U.S. Provisional Application No. 60/597,851 filed Dec. 21, 2005, and is a continuation-in-part of U.S. application Ser. No. 11/160,885 filed Jul. 14, 2005, now U.S. Pat. No. 7,256,714, which is a continuation of U.S. application Ser. No. 10/617,602 filed Jul. 11, 2003, now U.S. Pat. No. 6,993,607, which claims priority from U.S. Provisional Application No. 60/395,368, filed Jul. 12, 2002.

BACKGROUND INFORMATION

The invention relates to method and apparatus for controlling an array of non-bistable keys, such as capacitive position sensors, and, more specifically for preventing accidental false inputs from keys adjacent to a selected key in a capacitive keyboard.

Arrays of capacitive proximity sensors are often used in keyboards, keypads and other touch-input apparatus. Two characteristics of capacitive sensors that lead to their use instead of conventional metallic switches are: 1) Capacitive sensors can be made in small sizes, which is desirable if a small, tightly packed keyboard is required; and 2) Capacitive sensors are particularly easy to environmentally seal, which is desirable if the keyboard is to be used in a wet environment or where there is a concern that contaminants may be spilled on the keyboard.

Conventional capacitive sensors, when tightly packed, or when used in the presence of conductive liquid films, suffer a keying ambiguity problem. In a small keyboard, for example, a user's finger is likely to overlap from a desired key to onto adjacent ones. This is especially problematic if the user has large fingers or if he or she presses on the keyboard surface hard enough to deform his or her finger. The same sort of effect is found when a conducting film is spilled on a keyboard, in which case the user's finger is sensed as though it were the size of the puddle. Problems of this sort are particularly acute in cash register keyboards used in food service establishments where beverage and food sauce spills are a frequent occurrence.

In his U.S. Pat. No. 5,730,165, the inventor teaches a capacitive field sensor employing a single coupling plate and a method of detecting a change in capacitance of the coupling plate, Cx, to ground. The apparatus taught in U.S. Pat. No. 5,730,165 comprises pulse circuitry for charging the coupling plate and for subsequently transferring the charge from the plate into a charge detector, which may be a sampling capacitor, Cs. The transferring operation is carried out by means of a transfer switch electrically connected between the coupling plate and the charge detector. The disclosure of U.S. Pat. No. 5,730,165 is herein incorporated by reference.

In his U.S. Pat. No. 6,466,036 the inventor teaches pulse circuitry for measuring capacitance to ground, the circuitry comprising a plurality of electrical switching elements, each of which has one side electrically connected to either a power supply voltage or to a circuit ground point. This circuit arrangement, which may be used with a keyboard as well as for many other applications, is more compatible with available integrated circuit design and manufacturing practices than is prior art pulse circuitry, which commonly had one side of at least one switching element floating. These improved arrangements thereby provide superior performance at a lower manufacturing cost. The disclosure of U.S. Pat. No. 6,466,036 is herein incorporated by reference.

SUMMARY OF THE INVENTION

One aspect of the invention is that it may provide an iterative method of removing keying ambiguity by measuring a detected signal strength associated with each key in an array, comparing the measured signal strengths to find a maximum, determining that the key having the maximum signal strength is the unique user-selected first key, and maintaining that selection until either the first key's signal strength drops below some threshold level or a second key's signal strength exceeds the first key's signal strength. When any key is selected its signal strength value may enhanced relative to all the other keys so as to deselect all other keys. In this aspect, the array under consideration may be a keyboard, or any convenient subset thereof.

A particular preferred embodiment of the invention is an array of capacitive keys in which each key has a respective detection integrator counter (DI) associated with it. Each DI is a clocked counter that counts up by one incremental value on each capacitive acquisition cycle during which a signal strength from the associated key is above some nominal threshold value, and that counts down toward zero if the signal strength is less than the nominal value. A controller receives a respective input from each DI and determines that one of the keys is selected, e.g., wins, when the detection integration (DI) count associated with that key meets a respectively selected terminal count value, TC. The incremental magnitude used for counting down can be the same as that for counting up, e.g., 1, or it can be different, e.g., 2, to preferentially accelerate the count-down 'losing' process over the winning process, in order to facilitate better suppression of noise. The rate of counting down any of the DI counters can also be the complete value, i.e., the DI can be cleared in one cycle. In this embodiment, when two or more keys have signal strengths above their nominal thresholds, the key with the lesser signal strength will have its associated DI decremented or cleared each cycle while this condition exists. If any two or more keys have equal and maximal signal strengths, such keys' DI's will continue to increment until the first to reach its TC 'wins' and is set as the unique user-selected key.

In another aspect of the invention, the DI of a key selected at a first instant may be decremented or cleared and that key deselected even if the signal strength of that key is above the threshold value and its DI equals its associated TC value, if second key becomes selected at a later instant by virtue of its signal strength being greater than the signal strength of the first key while also being above its own threshold value and having its associated DI equal its associated TC. If there are multiple keys with signal strengths above their associated threshold values, their associated DIs will count up and down in competition, until one key's DI finally equals its TC and wins over all others including over the previously selected key.

In the above discussions, it should be understood that the principle of having one signal greater than another has been somewhat simplified for explanatory purposes. In order to avoid indecisiveness and eliminate oscillation between two or more keys having more or less the same signal strengths, the winning key may preferably be given a slight advantage in subsequent repetitions of the decision process. This may be done, for example, by requiring a non-selected key's signal to exceed the currently selected key's signal by a small amount. This can be done by subtracting a small amount off the signals of non-selected keys, or by adding a small amount onto the selected key's signal.

An advantage of this method over those disclosed in my U.S. Pat. No. 6,993,607 is that the method disclosed herein permits the smooth rollover of key selection as a finger slides from one key to the next, while still reducing key ambiguity. In the aforementioned patent, the first key to win remains selected even if the maximal signal strength has shifted to a new key, provided that the first key has enough signal strength left to retain its state, i.e., by having its signal strength in excess of its associated threshold value. Therefore the instant invention may be referred to as 'non-locking' key ambiguity reduction.

In yet another aspect of the invention, if the signal strengths of two keys that are approaching a detection threshold value and that are both in a defined keyboard neighborhood both exceed the threshold value and their signal strengths are equal to each other (or are within a selected tolerance value) at the same time, an algorithm executed by a controller may be used to declare one of the two keys to be active and the other to be inactive. It will be recognized that a wide variety of algorithms are possible and include, but are not limited to, a random, or pseudo-random selection of the active key, or a declaration of activity based on which key was scanned first.

The principle also applies in the minimal case where the DI's terminal count (TC) is chosen to be equal to one. This is functionally the same as though there were no DI, but rather just a simple signal comparison function with an inhibiting logic gate following it. Here, the inputs to the inhibiting gate also includes the logical comparisons of the signal strengths among the keys in a neighborhood in order to skew subsequent comparisons to favor the already selected key over competing keys having respective output signals above respective threshold values.

Those skilled in the keyboard arts will understand that the above-mentioned neighborhoods can be defined in a wide variety of ways. In some cases, a neighborhood of a given key may consist of all the keys immediately adjacent the given key, or may comprise all the keys having no more than one key between them and the given key. In other cases, the neighborhood may comprise all the keys in a matrix array—e.g., in a keyboard for use in a numerical data entry application in which only one key is to be active at a time so that the sequence of input digits is uniquely determined. In other cases, such as in a typing or computer-input keyboard, the neighborhood of a key may comprise all other keys in the keyboard except for special purpose keys, such as a capitalization shift key, a control key, and the like. Moreover, some embodiments of the invention provide a keyboard that is configurable by a user who programs a controller to selectively consider or ignore various keys in an array. In some cases there might be two neighborhoods, each acting independently of the other for key ambiguity resolution purposes.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

DETAILED DESCRIPTION

In studying this Detailed Description, the reader may be aided by noting definitions of certain words and phrases used throughout this patent document. Wherever those definitions are provided, those of ordinary skill in the art should understand that in many, if not most instances, such definitions apply to both preceding and following uses of such defined words and phrases. At the outset of this Description, one may note that the terms "include" and "comprise," as well as derivatives thereof, mean inclusion without limitation; the term "or," is inclusive, meaning and/or. The word 'key' as generally used in this Disclosure and as specifically used in the Claims attached hereto refers to a touchable portion of a mechanical to electrical transducing device that is non-bistable in nature. This term specifically excludes conventional mechanical switches in which two or more electrical conductors are moved into or away from contact with each other to make or break an electrical connection. The terms 'keyboard', 'key pad' and the like all refer to arrays of keys for data input without limitation as to the size or configuration of the array. A 'key' can also be a dimensional sensing surface such as an XY touch screen or a 'trackpad', or a sensing zone not intended for normal human data entry such as an object or body part sensor. 'Touch' can mean either human or mechanical contact or proximity to a key. 'User' can mean either a human or a mechanical object. A 'finger' can be, inter alia, a human finger, a mechanical finger or a stylus.

Capacitive sensors, unlike bistable electromechanical switches which are either open or closed, provide a signal that varies with the degree of touch or extent or coupling between a user's finger and a sensing element of a keyboard. Other non-bistable touch sensors, such as an array of piezoelectric sensors in which the output from a given sensor increases with increasing activation force, share many of the properties of capacitive keys. Thus, much of the subsequent disclosure should be understood as being relevant to non-capacitive keys that also provide an output signal responsive to a degree of coupling between the key and a user's finger, stylus, or other key-activating or pointing implement that is proximate the key.

Figure 1A:
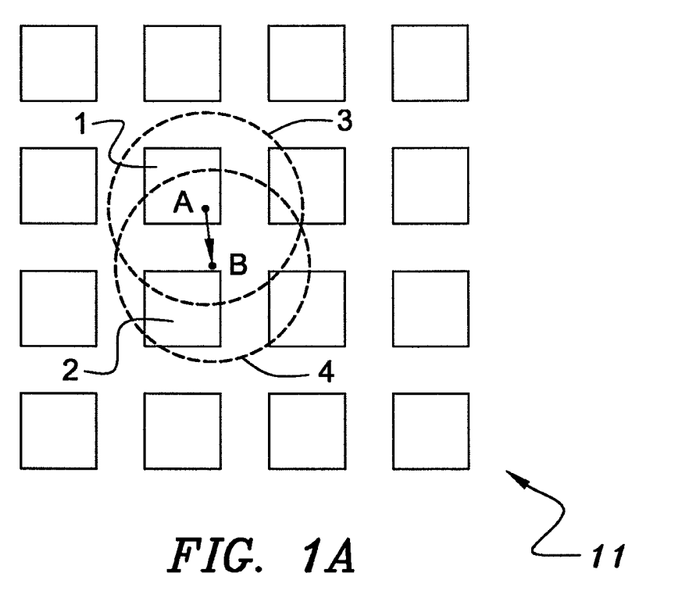
FIGS. 1a to 1c show an array of tightly spaced capacitive buttons.

Turning now to FIG. 1A, one finds an array of 'N' tightly spaced capacitive keys in a key panel 11 which would benefit from the invention. When using such small key panels it is inevitable that a finger will encompass much more than the intended key. A finger touching a principle desired key electrode 1 could easily create a 'fingerprint' outline 3, as shown in dashed lines, where the fingerprint has a centroid location A. This fingerprint also encompasses keys other than the intended key. The amount of intersecting surface area between the dashed line and each key area is a reasonable representation of the amount of signal level change each intersected key will receive due to the touch, although even non-touched keys will also see an increase in signal due to mere finger proximity and to fringe-field effects within the touch panel.

In this case, the desire is to select the one and only one key which is intended by the user while suppressing outputs from adjacent keys intersected by the fingerprint. In this 'non-locking' key suppression invention, if the finger slides to a new key location 4, shown dotted with its centroid at location B, where the movement is shown by the arrow from A to B, this movement will not cause the first key 1 to remain solely active even though it has sufficient signal to still retain its state, i.e., its signal still lies above its threshold level despite being reduced by the movement to a new key. Instead, the invention provides that the newly intended key 2, having a larger signal level due to a higher degree of fingerprint intersection than key 1, becomes the solely active key by switching off the active state of key 1.

Figure 1B:
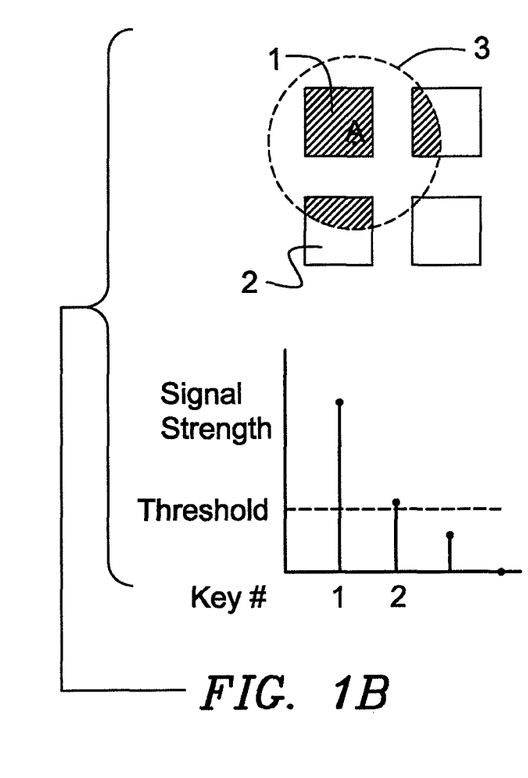
Figure 1C:
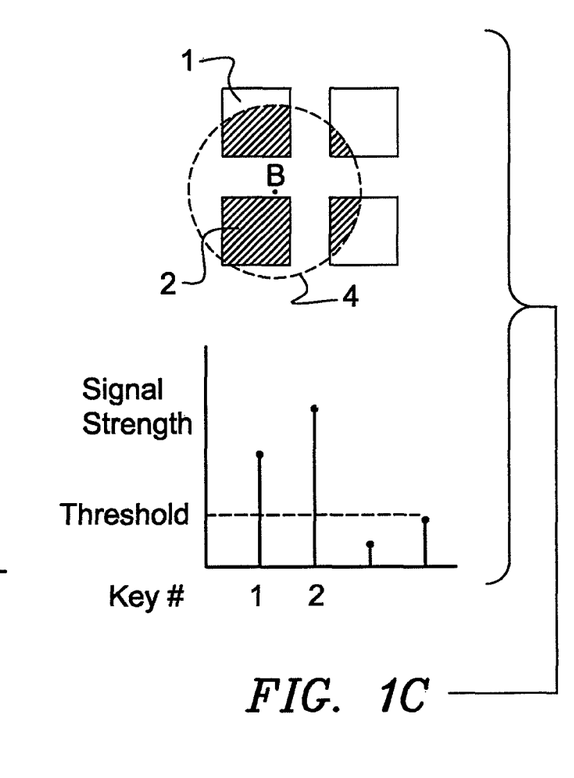

FIGS. 1b and 1c further detail the change in signals on the keys of FIG. 1a by virtue of the relative electrode surface intersections with the fingerprint first at location A (FIG. 1b) and then at location B (FIG. 1c). The signal strengths are shown in the bar plots in the lower portions of the respective figures. It is desired that in order for a key to 'win' the status of user-selected key, its signal change must exceed a threshold value, and its signal has to be the largest. In FIG. 1b, key 1 wins. In FIG. 1c, key 2 wins.

If the key selection method operates solely by picking a maximum signal strength, the keyboard may be subject to an undesirable rapid switching back and forth between two keys having nearly-identical signal strengths (e.g., fingerprint areas). This sort of 'chatter' is preferably prevented by biasing or skewing the key selection method to favor an already selected key. That is, the switchover process is made slightly more difficult than would occur with straight equivalence. This bias may be provided in many ways in subsequent key selection decisions. These ways may be equivalent to adding an incremental value to the signal associated with the selected key; multiplying the signal strength of the selected key by a value greater than one in subsequent selections; subtracting a respective incremental value from the signal strengths associated with each of the non-selected keys; or multiplying the signal strength of each of the non-selected keys by a respective value less than one.

Figure 2:
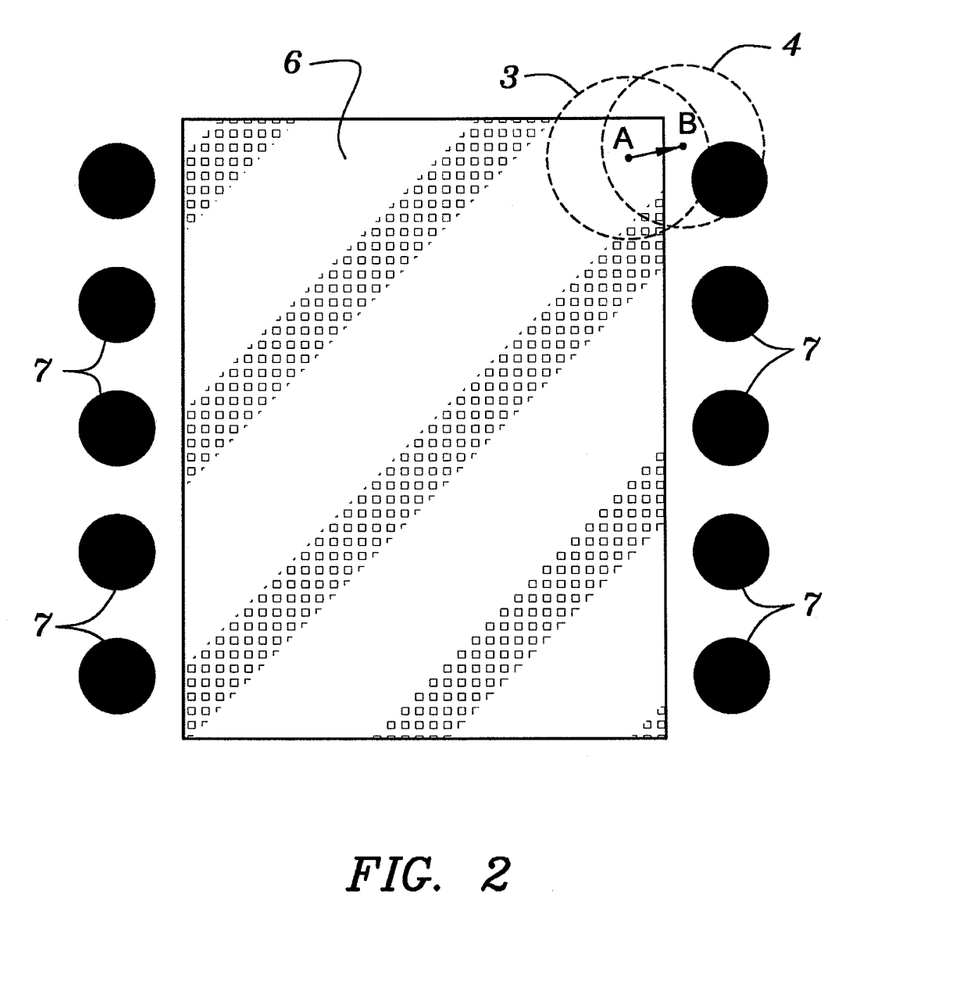
FIG. 2 shows a 2-D touch surface such as a capacitive mouse surface or a capacitive touch screen, with buttons around it.

FIG. 2 shows a configuration of a capacitive mouse or capacitive touch screen area 6 with surrounding buttons 7. The principles of operation described in conjunction with FIG. 1a-c apply similarly to FIG. 2, in that the area 6 can be treated as a single key with a single signal strength for purposes of key suppression. FIG. 2 applies when the keys 7 are very close to pointing surface 6 and fingerprints 3 and 4 can overlap both the capacitive screen and one or more capacitive buttons. Moreover, it should be recognized that although the drawing depicts a two-dimensional touch surface, the same considerations apply to a one-dimensional touch surface of the sort commonly referred to as a slider, scroll-wheel, or the like.

Figure 3:
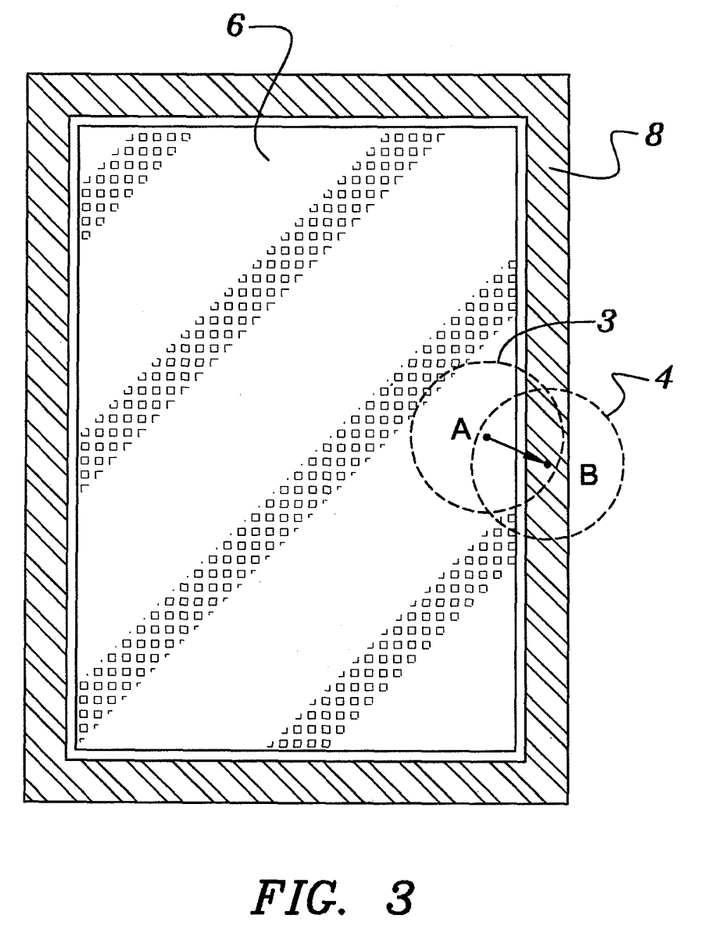
FIG. 3 shows a 2-D touch surface such as a capacitive mouse surface or a capacitive touch screen, with a guard ring disposed around it to suppress activation of the touch screen area when a finger strays just outside the 2-D mouse or screen area.

FIG. 3. shows a configuration of a capacitive touch input area 6 with a surrounding 'key' 8. The principles of operation described in conjunction with FIG. 1 apply similarly to FIG. 3, in that the area 6 can be treated as a single key with a single signal strength for purposes of key suppression, while the outer 'key' 8 acts to detect errant touch which falls partially on both 6 and 8. The area 6 can comprise any suitable input arrangement such as a capacitive mouse surface, a capacitive touch screen or a keypad comprising discrete keys.

In this example, the guard electrode 8 is not necessarily intended as an actual control key. A finger sliding from 3 to 4 would still potentially leave the active screen 6, but in fact the touch would not be legal since its areal centroid at 'B' lies principally outside the input area. 'Key' 8 detects this out-of-position fingerprint and appropriate logic causes the screen 6 to fall out of detection or to be ignored by further processing. It may be noted that some uses of the guard ring structure do not involve having a finger touching the keypad. For example, one could arrange a guard ring around a capacitive cell phone keypad and use the guard ring output to suppress readings from all the keys in the keypad while the user was talking on the cell phone and holding the keypad of the phone against his or her head.

The guard electrode 'key' 8 in the latter case can also be a discrete solid electrode shape, for example a rectangle, disk, arc, or stripe or other shape, placed in some other location reasonably proximate input area 6. This guard electrode would be activated by placing the product against the user's head or other body part (for example placing the product in a clothing pocket with the keypad side towards the user's body) in order to suppress further output from the keypad under such adverse conditions. A suitable position for such a 'key' might be near the earpiece of a cell phone, some distance away from the keypad or touchscreen.

The guard electrode 'key' 8 can also be either a ring as shown in FIG. 3, or a discrete solid electrode shape, such as a rectangle, disk, arc, or stripe or other shape, placed in some other location reasonably proximate the input area 6 so as to be activated by a mechanical closure. This could provide a cover which, when closed, would cause the guard key 8 to induce the suppression of input area 6.

In order to make the determination of an out-of-position fingerprint for use with the apparatus shown in FIG. 3, the same sorts of biasing arrangements can be used to prevent chatter as discussed supra. However, relationships described above with respect to FIG. 2 presume the gain of the sensing channels with respect to finger surface area to be comparable, so that equivalent fingerprint surface areas on different keys produce comparable signal changes. This is not always the case in any of the instances described with respect to FIGS. 1a-c, 2 or 3. The electrode sizes of different keys may not be equal, and for various reasons (such as stray loading capacitance variations, etc.) the electrical gains among the various keys can differ. In these instances the incremental values added might be negative. Alternatively, signals from competing keys could be scaled into a state of equivalence by using scaling constants that are experimentally determined to accord with a particular configuration. In any event, one can scale and/or offset the signals into equivalence for comparison purposes and thereby create the desired suppression effect without chatter.

Figure 4:
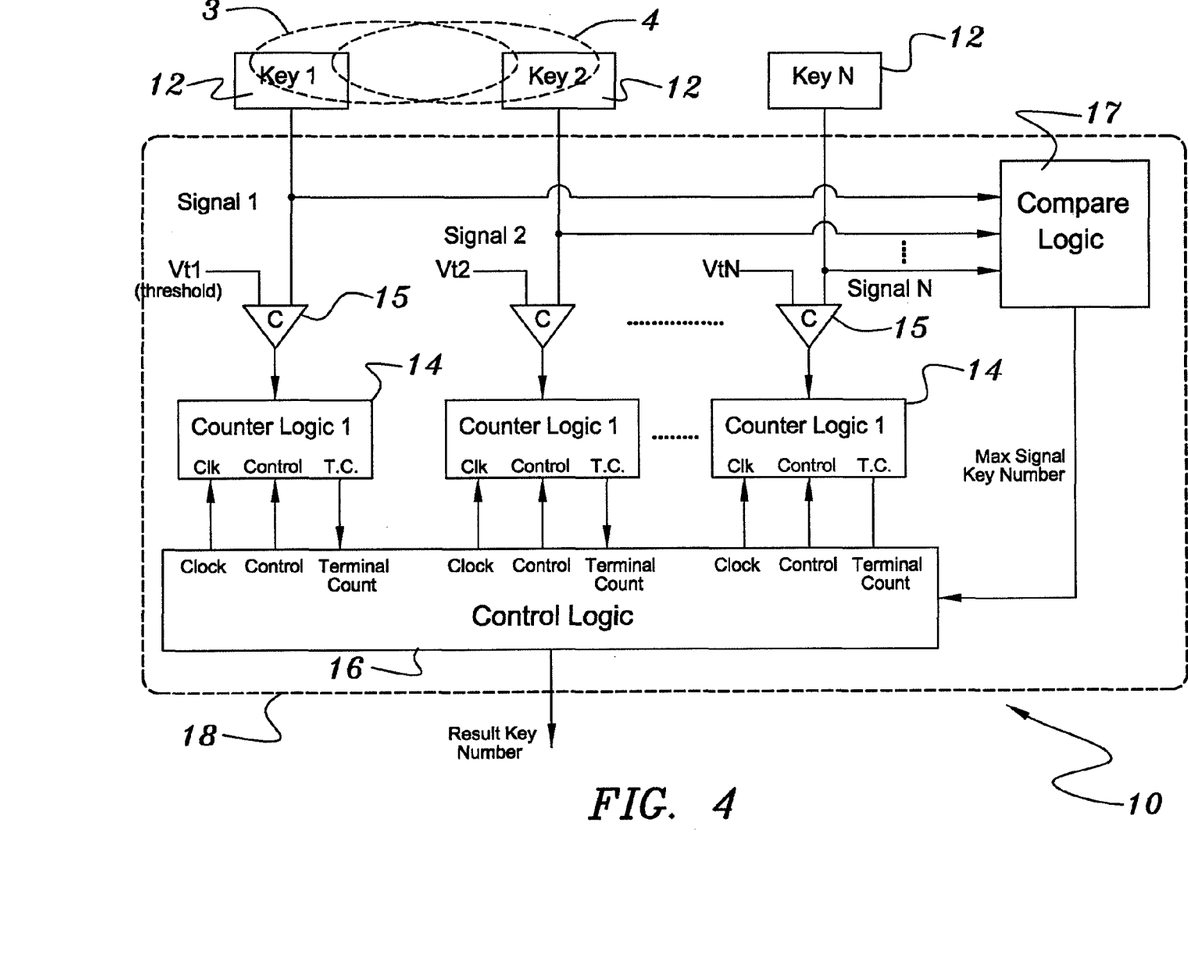
FIG. 4 is a schematic block diagram of a preferred apparatus of the invention.

Turning now to FIG. 4, one finds a schematic representation of apparatus of the invention 10, comprising an array of N capacitive proximity sensors 12 labeled "Key 1", . . . , "Key N". Each of the sensors 12 has an output to a respective counter logic 14 that supplies data to and is controlled by suitable control logic 16. Those skilled in the electronic arts will appreciate that although the counters 14 and control logic 16 are depicted with discrete blocks in the schematic diagram, these features could be provided either by separate physical circuit elements, or could all be provided by a single microcontroller, as depicted by the dashed phantom line 18 in FIG. 4. Moreover, although the array of keys 12 is depicted as being a simple linear array, it will be appreciated by one who reads the complete disclosure contained herein that many other sorts of arrays can be used and will encompass, without being limited to, arrays used as computer keyboards, keypads of the sort commonly used in telephony and automated banking, cash register data input keyboards, etc., as well as various other configurations discussed in conjunction with FIG. 3.

The addition of counters 14, or of the logical function equivalent thereof, when used in the accordance with the teachings of this disclosure, can remove or resolve ambiguities by methods involving comparison of signal strengths from various keys 12. This process involves examining the differences over one or more sequential signal samples.

Figure 5A:
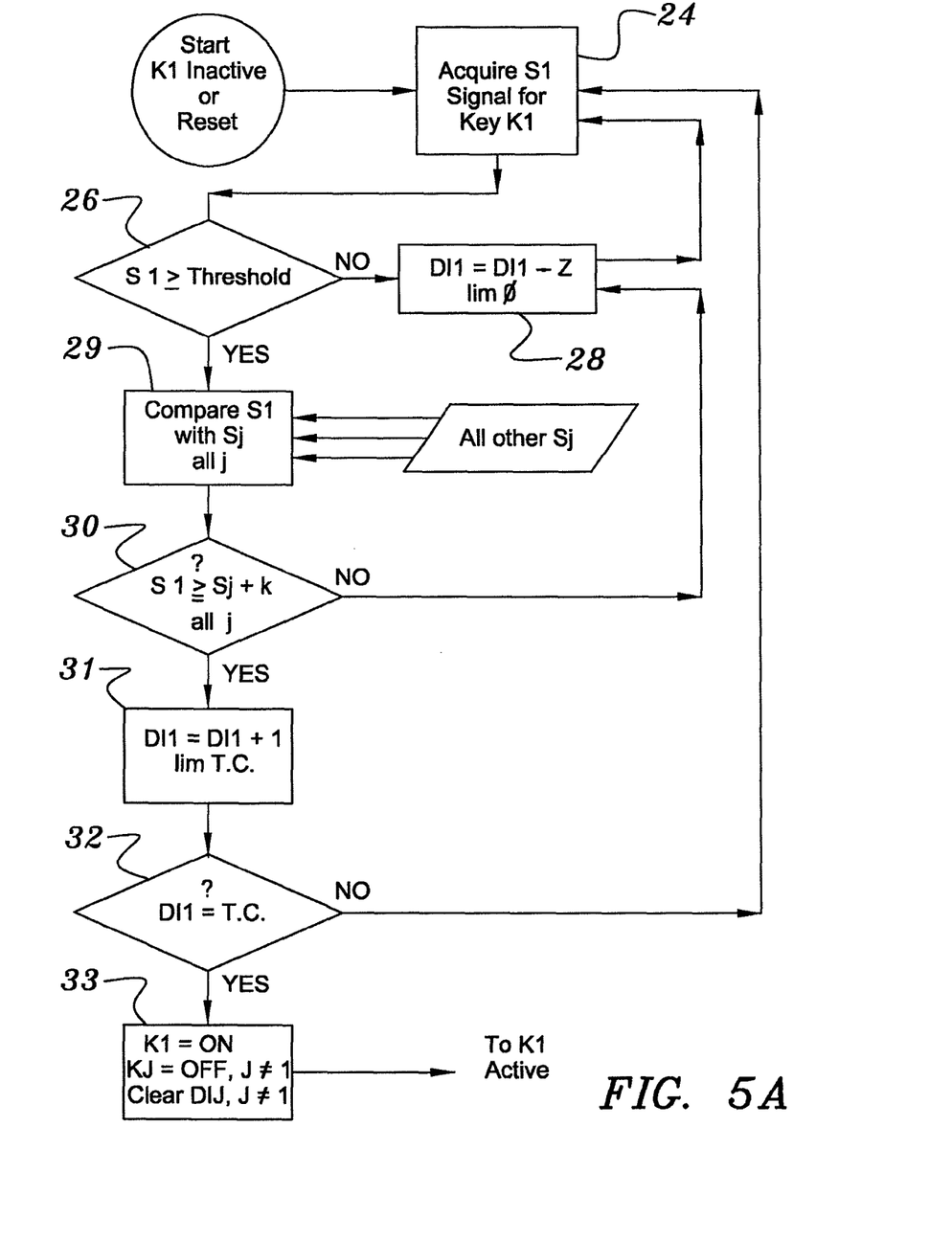
FIG. 5a is a flow chart showing logical operations carried out in a preferred method of the invention when Key 1 is initially active.
Figure 5B:
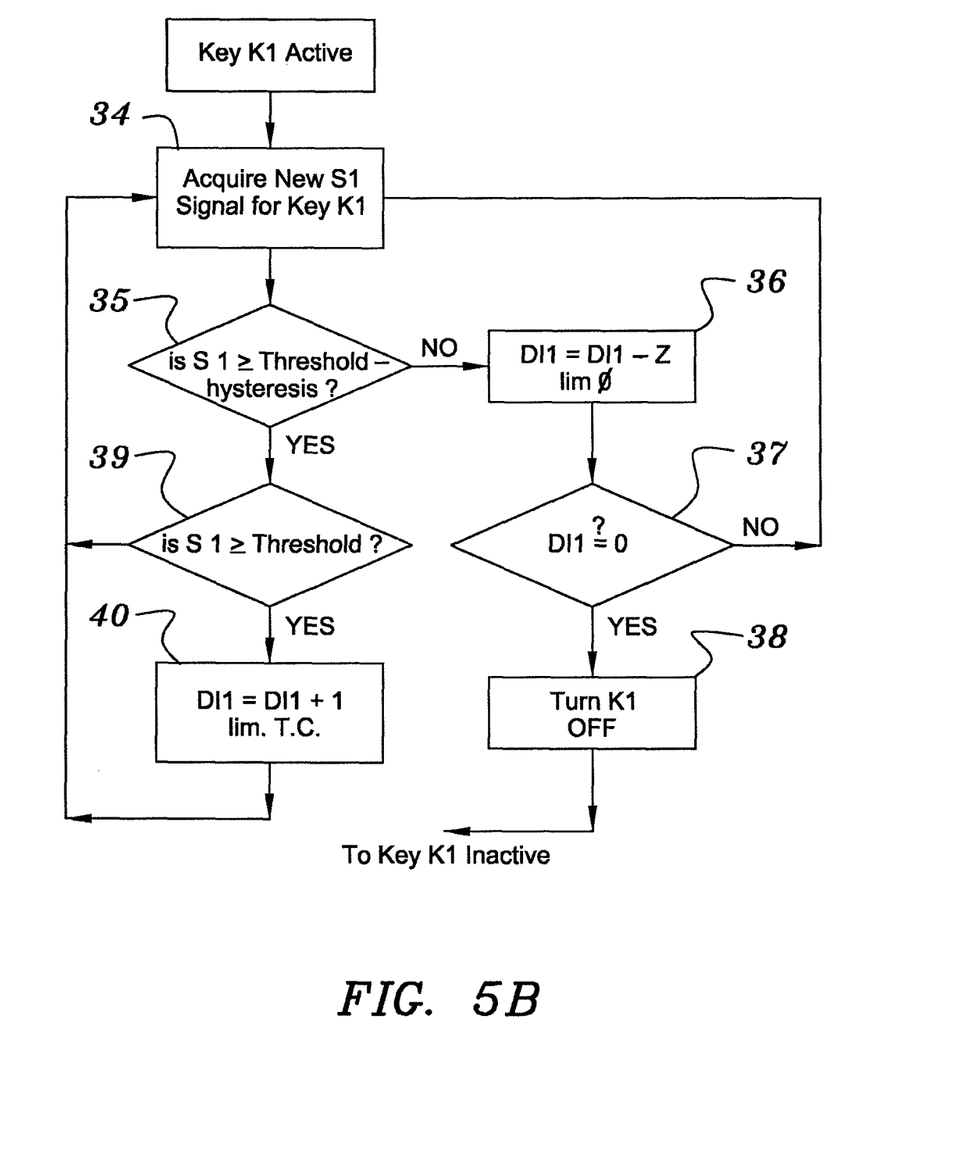
FIG. 5b is a flow chart showing logical operations carried out in a preferred method of the invention when Key 1 is initially inactive.

Turning now to FIGS. 5a and 5b, one finds flow charts depicting a preferred method of the invention for operating the apparatus 10 so as to suppress extraneous key signals or to otherwise resolve keying ambiguities. This method may be carried out by a microprocessor 18 operating under control of a program stored in a, preferably, non-volatile memory, or may be carried out by means of discrete circuit elements connected to provide hardwired logic. Although the flowcharts of FIGS. 5a and 5b depict operation in terms of a single sensor key 1 (variously labeled "Key 1" or "K1") with associated signal level S1 and associated Detection Integrator DI1, it will be understood that this simplification is solely in the interest of clarity of presentation and that an algorithm controlling an actual keyboard could carry out substantially the depicted method for each of the N keys in a parallel fashion.

The depicted method relies on iterated comparisons of sensor outputs, and selects a single sensor output to become active or 'on' based on that sensor both having an output in excess of a detection threshold for some selected number of counter cycles (which may be one) and thereafter having the highest output of all the sensors in the array that have also exceeded the detection threshold for the selected number of cycles of the counters. It will be recognized that one could choose to clock all the counters in parallel in order to achieve this, or that one could scan through the counters and operate them one at a time in rapid succession so as to provide the selected number of counter cycles for each sensor within a sufficiently short time period that a user could not perceive a delay in operation of the keyboard.

A signal S1, acquired from sensor key K1 (Step 24), is compared with a selected signal threshold value (Step 26). If S1 is less than the threshold value, the value, DI1, in the DI associated with K1 is decremented by a selected amount (Z) or otherwise reduced (Step 28) if it is greater than zero. If the value S1 is at or above its detection threshold, it is then compared against all other signals Sj in Step 29. If it has the strongest change in signal due to touch, subject to a possible non-dithering bias value 'k' if another key is active (Step 30) then counter DI1 can increment (Step 31). If the condition of Step 30 is not met, DI1 is decremented or otherwise reduced (Step 28). Only if the counter DI1 equals terminal count value TC (Step 32) does the key become active or ON in Step 33. When it does so the control logic forces all other active keys to become inactive and resets their respective DI counters. In keyboards comprising a large number of keys, only one of which should be active at a time, this OFF status will, of course, be the predominant result of an analysis of the output of any given key. The action of incrementing or decrementing of counter values as described supra can be numerically reversed to achieve the same effect and should be considered to be logically equivalent to the above explanation.

Note that in FIG. 5a, in order for a key to gain dominance over an already active key, it must exceed the active key's last measured signal level by a small added amount 'k', as shown in Step 30 to prevent selection dithering. Although the value k is depicted as an additive constant, it can also be determined as a percentage of the signal level of the active key, or by any of a number of other methods. The incremental value 'k' can also be zero, i.e., nothing is added or subtracted, although this would tend to make the decision process unstable should there be any small amount of signal noise which would introduce dithering between two competing keys. Finally the key K1 can gain dominance in Step 33 if the TC is reached, and when it does so it forces all other active keys to become inactive and resets their DI counters.

Turning off a key can be forced via a different key winning in its Step 33, as shown in FIG. 5a, or it can be carried out according to the method depicted in FIG. 5b. Whether a key remains on, in the absence of any other keys with larger signals (FIG. 5a), is determined by whether the key's signal change remains above a hysteresis level. In Step 35, the determination is made if the signal is below the hysteresis point, and if so the DI is reduced in value by some known amount 'Z' (Step 36). If the DI count falls to zero, the key is made inactive (Step 38). On the other hand, if the signal change remains above the threshold level, the DI counter is increased again to its limit TC (step 40). If the signal falls between the threshold and the hysteresis level, the DI counter remains unchanged.

It should be noted that the case where TC=1 also works with the flow of FIGS. 5a and 5b.

There are, of course, many possible variations and extensions of the procedure sketched out in FIG. 4 and FIGS. 5a,b. For example, one may consider a rare case in which a user brings his or her finger up to a keyboard so that the point of touch is exactly between two keys. In this case, one could modify the depicted process to either select just one of those keys (e.g., by means of a known pseudo-random number selection algorithm, or by sample sequence order) or by suppressing the output of both keys until the user move his or her finger enough that one of the two keys had a higher output than the other.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:
1. An apparatus comprising:
plurality of keys;
control logic operatively coupled to the plurality of keys and configured to:
analyze, to determine a first active key, respective first signal values of the plurality of keys;
assign, based at least on the respective first sensor values of the plurality keys, a first key as the first active key; and
analyze, to determine a second active key, respective second signal values of the plurality of keys, the analysis, to determine the second active key, of the respective second signal values of the plurality of keys being biased in favor of the first key.

2. The apparatus of claim 1, wherein each key comprises a respective capacitive proximity sensor.

3. The apparatus of claim 1, wherein at least one key of the plurality of keys comprises a guard ring disposed around at least another key of the plurality of keys.

4. The apparatus of claim 1, wherein the control logic is configured to bias the analysis, to determine the second active key, of the respective second signal values of the plurality of keys in favor of the first key by increasing the respective sensor value associated with the first key.

5. The apparatus of claim 1, wherein each of the plurality of keys has an associated counter and the control logic is configured to bias the analysis, to determine the second active key, of the respective second signal values of the plurality of keys in favor of the first key by changing a value stored in at least one of the counters.

6. The apparatus of claim 1, wherein the control logic comprises a microcontroller.

7. A method comprising:
analyzing, to determine a first active key, respective first sensor values of a plurality of keys;
assigning, based at least on the respective sensor values of the plurality keys, a first key as the first active key; and
analyzing, to determine a second active key, respective second signal values of the plurality of keys, the analysis, to determine the second active key, of the respective second signal values of the plurality of keys being biased in favor of the first key.

8. The method of claim 7, wherein the respective sensor values are representative of a respective capacitance of a respective key of the plurality of keys.

9. The method of claim 7, wherein at least one key of the plurality of keys comprises a guard ring disposed about at least one other key of the plurality of keys.

10. The method of claim 7, comprising biasing the analysis, to determine the second active key, of the respective second signal values of the plurality of keys in favor of the first key by increasing the respective sensor value of the first key.

11. The method of claim 7, comprising decreasing, when analyzing, to determine a second active key, respective second signal values of the plurality of keys, the respective sensor values associated with each of the keys other than the first key.

12. The method of claim 7, wherein each key of the plurality of keys has an associated counter and biasing the analysis, to determine the second active key, of the respective second signal values of the plurality of keys in favor of the first key comprises changing a value stored in at least one of the counters.

13. Logic embodied in a non-transitory computer-readable medium, the logic configured when executed to perform operations comprising:
analyzing, to determine a first active key, respective first sensor values of a plurality of keys;
assigning, based at least on the respective sensor values of the plurality keys, a first key as the first active key; and
analyzing, to determine a second active key, respective second signal values of the plurality of keys, the first key being biased during the analysis, the analysis, to determine the second active key, of the respective second signal values of the plurality of keys being biased in favor of the first key.

14. The logic of claim 13, wherein the respective sensor values are representative of a respective capacitance of a respective key of the plurality of keys.

15. The logic of claim 13, wherein at least one key of the plurality of keys comprises a guard ring disposed about at least one other of key of the plurality keys.

16. The logic of claim 13, comprising biasing the analysis, to determine the second active key, of the respective second signal values of the plurality of keys in favor of the first key by increasing the respective sensor value of the first key.

17. The logic of claim 13, configured when executed to perform operations comprising decreasing, when analyzing, to determine a second active key, respective second signal values of the plurality of keys, the respective sensor values associated with all each of the keys other than the first key.

18. The logic of claim 13, wherein each key of the plurality of keys has an associated counter and biasing the analysis, to determine the second active key, of the respective second signal values of the plurality of keys in favor of the first key comprises changing a value stored in at least one of the counters.

19. The apparatus of claim 1, wherein the control logic is configured to assign the first key as the second active key.

20. The apparatus of claim 1, wherein the control logic is configured to assign, based at least on respective first sensor values of the plurality keys, the first key as the first active key based on:
the respective first sensor value of the first key exceeding a threshold; and
the respective first sensor value of the first key exceeding the respective sensor values of the other keys in the plurality of keys.

21. The apparatus of claim 1, wherein the control logic is configured to assign, based at least on respective second sensor values of the plurality keys, a second key as the second active key based at least on the respective second sensor value of the second key exceeding the respective second sensor value of the first active key by a particular amount, the first key and the second key being different keys.

22. The method of claim 7, comprising assigning the first key as the second active key.

23. The method of claim 7, comprising assigning, based at least on respective first sensor values of the plurality keys, the first key as the first active key based on:
the respective first sensor value of the first key exceeding a threshold; and
the respective first sensor value of the first key exceeding the respective sensor values of the other keys in the plurality of keys.

24. The method of claim 7, comprising assigning, based at least on respective second sensor values of the plurality keys, a second key as the second active key based at least on the respective second sensor value of the second key exceeding the respective second sensor value of the first active key by a particular amount, the first key and the second key being different keys.

* * * * *